US006448992B1

United States Patent
Touzelbaev

(10) Patent No.: US 6,448,992 B1
(45) Date of Patent: Sep. 10, 2002

(54) VOLTAGE PROGRAMMABLE POWER DISSIPATER

(75) Inventor: Maxat Touzelbaev, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/040,052

(22) Filed: Nov. 7, 2001

(51) Int. Cl.[7] .................................................. B41J 2/36
(52) U.S. Cl. ....................... 347/194; 347/192; 347/206; 347/209
(58) Field of Search ............................ 347/192, 194, 347/206, 209

(56) References Cited

U.S. PATENT DOCUMENTS

| | | | | |
|---|---|---|---|---|
| 3,918,300 A | * | 11/1975 | Weisstuch et al. | 374/170 |
| 4,223,207 A | * | 9/1980 | Chow | 219/482 |
| 4,277,672 A | * | 7/1981 | Jones | 219/203 |
| 4,366,039 A | * | 12/1982 | Uchida et al. | 204/406 |
| 4,434,354 A | * | 2/1984 | Nakata | 347/190 |
| 4,479,132 A | * | 10/1984 | Iwakura | 347/195 |
| 4,514,737 A | * | 4/1985 | Suzuki | 101/93.29 |
| 5,633,671 A | * | 5/1997 | Watanabe | 347/14 |

* cited by examiner

Primary Examiner—Bao Q. Vu

(57) ABSTRACT

Apparatus herein provides for a chosen level of power dissipation of a resistor, for example, the heating element of a thermal head assembly. The resistance of the resistor changes upon a change in temperature thereof, for example, due to increased flow of current therethrough. The apparatus includes a resistive shunt in series with the resistor, a first differential amplifier, with voltage drop across the resistor being provided to first and second input terminals of the first differential amplifier, and a second differential amplifier, voltage drop across the shunt being provided to first and second input terminals of the second differential amplifier. The output signals from the first and second differential amplifiers are provided to a voltage multiplier. The output signal from the voltage multiplier is provided to an input terminal of a power operational amplifier, and a programming sequence voltage is supplied to another input terminal of the power operational amplifier. The output signal from the power operational amplifier is provided to the resistor.

9 Claims, 2 Drawing Sheets

VOLTAGE PROGRAMMABLE POWER DISSIPATER

BACKGROUND OF THE INVENTION

1. Field of the Invention

This invention relates generally to semiconductor technology, and more particularly, to maintaining substantially constant temperature of a semiconductor device under test.

2. Discussion of the Related Art

Semiconductor devices typically undergo a variety of electrical test procedures, including short-circuit tests, burn-in tests, and functional device tests to ensure their proper operation. During for example functional testing, it is important that the temperature of the device under test be held at the chosen, substantially constant value. However, during such functional testing, the power level of the device may vary greatly, causing the temperature of the device to fluctuate. In dealing with this problem, it is known to provide a thermal head assembly 20 a surface 22 of which may be brought into contact with the lid 24 of the device under test 26, for example, a flip-chip mounted on a printed circuit board 28 (FIG. 1). The thermal head assembly 20 includes an electrical heating element 30 in the form of a resistor, the output of which can be increased and decreased by respectively increasing and decreasing electrical current flow therethrough, and a passage 32 through which coolant 34, for example, water, may flow. By changing electrical current flow and/or providing or cutting off coolant flow, the temperature of the thermal head assembly 20, and thus the temperature of the device under test 26 adjacent thereto, can be adjusted or varied. As the temperature of the device under test 26 varies due to changes in power level thereof as described above, the temperature of the thermal head assembly 20 is caused to change to compensate for the changing temperature of the device 26, in order to attempt to maintain the device under test 26 at a constant, chosen temperature.

As pointed out above, changes in power level of the device under test 26 cause the device temperature to change. Changes in power level of the thermal head assembly 20 also cause the device under test 26 temperature to change. The temperature of the device under test 26 can be kept substantially constant if the total power dissipated by the thermal head assembly 20 and device under test 26 can be held substatially constant. Since the device under test 26 runs through a known or substantially known testing sequence, the individual levels of power dissipated by the device 26 over time during this testing sequence can be known. Based on this information, the thermal head assembly 20 can be caused to have individual levels of power dissipated thereby over time so that during the time period of the testing sequence, the total of the power dissipated by the thermal head assembly 20 plus the power dissipated by the device under test 26 remains substantially constant.

Since the heating element 30 has a known resistive value, it would appear that a certain power level to be dissipated by the thermal head assembly 20 can be readily achieved by providing a chosen current or chosen voltage to the heating element 30. However, some pure metals used as heating elements have a thermal coefficient of electrical resistance of about 1/300 per ° C. at approximately room temperature. If the temperature of a heating element 30 made of such material increases from for example 20° C. (approximate room temperature) to 95° C., the resistance of the heating element 30 can change approximately 25 percent. It will readily be seen that if a chosen current is applied to such a heating element 30 with such heating element 30 at an elevated temperature, more power will be dissipated than predicted, due to this increased resistance. Conversely, if a chosen voltage is applied to the heating element 30, current therethrough will decrease due to increased resistance, and less power will be dissipated thereby than predicted.

Therefore, what is needed is apparatus for providing that the signal applied to the heating 30 element for determining the power level thereof is adjusted to compensate for a variation in resistance of the heating element 30 due to changes in temperature thereof.

SUMMARY OF THE INVENTION

The apparatus shown and described herein provides for a chosen level of power dissipation of a resistor, with the resistance of the resistor changing upon a change in temperature thereof, and uses feedback circuitry to correct for variations in the resistance of the resistor. The apparatus includes a shunt in series with the resistor, a first differential amplifier, with voltage drop across the resistor being provided to first and second input terminals of the first differential amplifier, and a second differential amplifier, voltage drop across the shunt being provided to first and second input terminals of the second differential amplifier. A voltage multiplier receives signals from the output terminals of the first and second differential amplifiers. An output terminal of the voltage multiplier is connected to an inverting input terminal of a power operational amplifier, and a programming sequence voltage is supplied to a non-inverting input terminal of the power operational amplifier. The output terminal of the power operational amplifier is connected to the resistor for providing voltage thereto.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention which illustrates the best mode presently contemplated by the inventor for practicing the invention.

Figure 1:
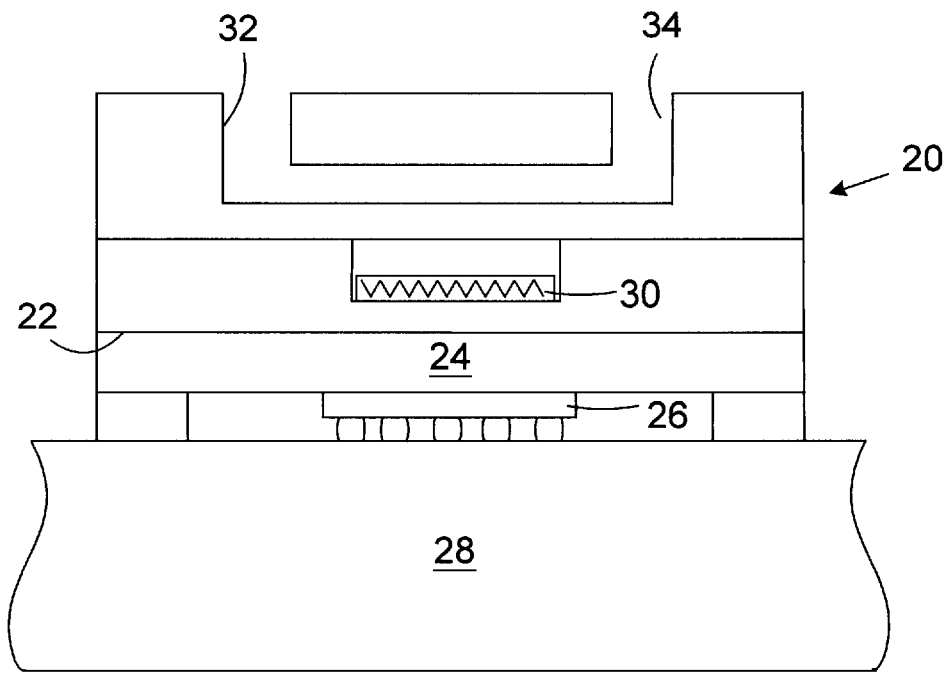
FIG. 1 is a sectional view of a thermal head assembly and device under test, for illustration of the present invention.
Figure 2:
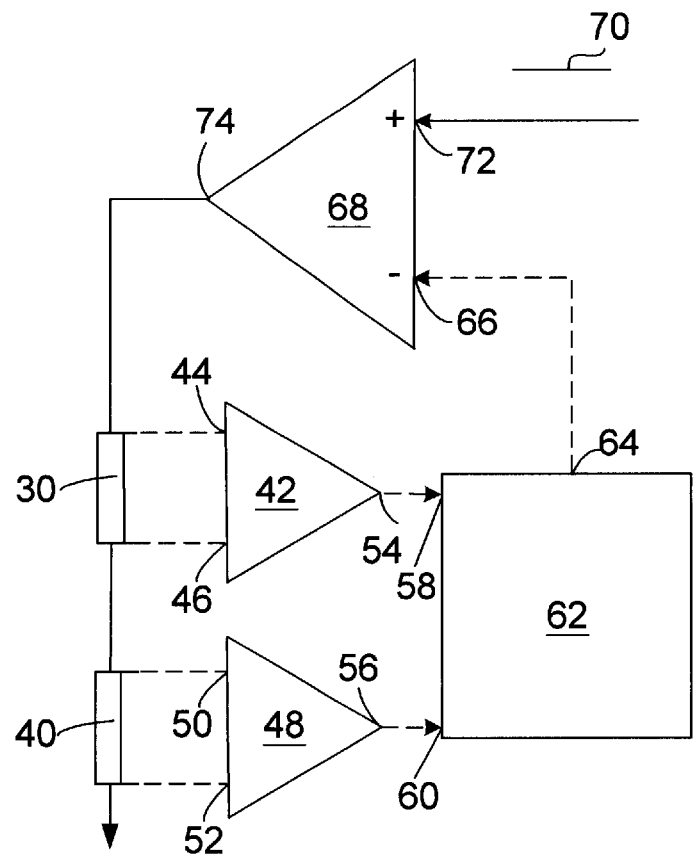
FIG. 2 is a schematic view of the present invention.

FIG. 2 illustrates a preferred embodiment of the present invention. As shown therein, the resistive heating element 30 of FIG. 1 is connected in a series with a shunt resistor 40. A first differential amplifier 42 has its input terminals 44, 46 connected across the heating element 30 so that a voltage drop across the heating element 30 is provided to these input terminals 44, 46. Similarly, a second differential amplifier 48 has its input terminals 50, 52 connected across the shunt 40 so that a voltage drop across the shunt 40 is provided to these input terminals 50, 52. The output terminals 54, 56 of the first and second differential amplifiers 42, 48 are connected to input terminals 58, 60 of a voltage multiplier 62, to provide signals thereto. The output terminal 64 of the voltage multiplier 62 is connected to a first, inverting input terminal 66 of a power operational amplifier 68 to provide signals thereto, and a programming sequence voltage signal 70 is provided to a second, non-inverting input terminal 72 of the power operational amplifier 68 (which can be configured in the form of an operational amplifier with an output power stage). The output terminal 74 of the power amplifier 68 is connected to the heating element 30 for providing signals thereto.

Since the resistor 30 is a heating element, the resistance thereof is chosen to be quite high. By comparison, the resistance of the shunt 40 is very low so that the shunt 40 dissipates negligible power compared to the resistor 30, and therefore has little temperature rise. in addition, the shunt material may be chosen to have a very low temperature coefficient, i.e., the resistance of the material remains substantially constant upon change in temperature, due to change in current level therethrough. Meanwhile the resistance of the heating element 30 may change significantly with changing temperature thereof due to change current level (and power level) therein, as described above. That is to say, for example, upon increase in current through the heating element 30, the resistance thereof increases, while resistance of the shunt 40 in series with the heating element 30 remains substantially constant. Conversely, upon decrease in current through the heating element 30, the resistance thereof decreases, while again resistance of the shunt 40 in series with the heating element 30 remains substantially constant.

In operation, a chosen level of programming signal voltage 70 is supplied to the power operational amplifier 68, based on a chosen level of power to be dissipated by the heating element 30 with the heating element 30 at for example room temperature, i.e., approximately 20° C. With current flowing through the heating element 30, however, the temperature thereof increases, as does the resistance thereof.

Voltage drop across the heating element 30 is provided to the input terminals 44, 46 of the differential amplifier 42, and voltage drop across the shunt 40 is provided to the input terminals 50, 52 of the differential amplifier 48. These respective voltage differences are provided to the voltage multiplier 62. Since the resistance of the shunt 40 does not change with changing current, the voltage reading across the shunt 40 is proportional to current therethrough, i.e., the reading across the shunt 40 actually measures current therethrough. With the voltage drop across the heating element 30 being supplied to the voltage multiplier 62, upon multiplication of these two received signals, the output of the voltage multiplier is proportional to the actual power level of the heating element 30. The output signal from the voltage multiplier 62 is supplied to inverting input terminal 66 of the power operational amplifier 68, the non-inverting input terminal 72 of which receives the programming signal as set forth above. With both such signals being provided to the power amplifier 68, the signal from the voltage multiplier 62, which is ideally equal in value to the programming signal 70 ensures that the output signal of the power operational amplifier 68, in the form of a voltage supplied to the heating element 30, is at a proper level to correct the power dissipation of the heating element 30, and bring it to the chosen level.

Figure 3:
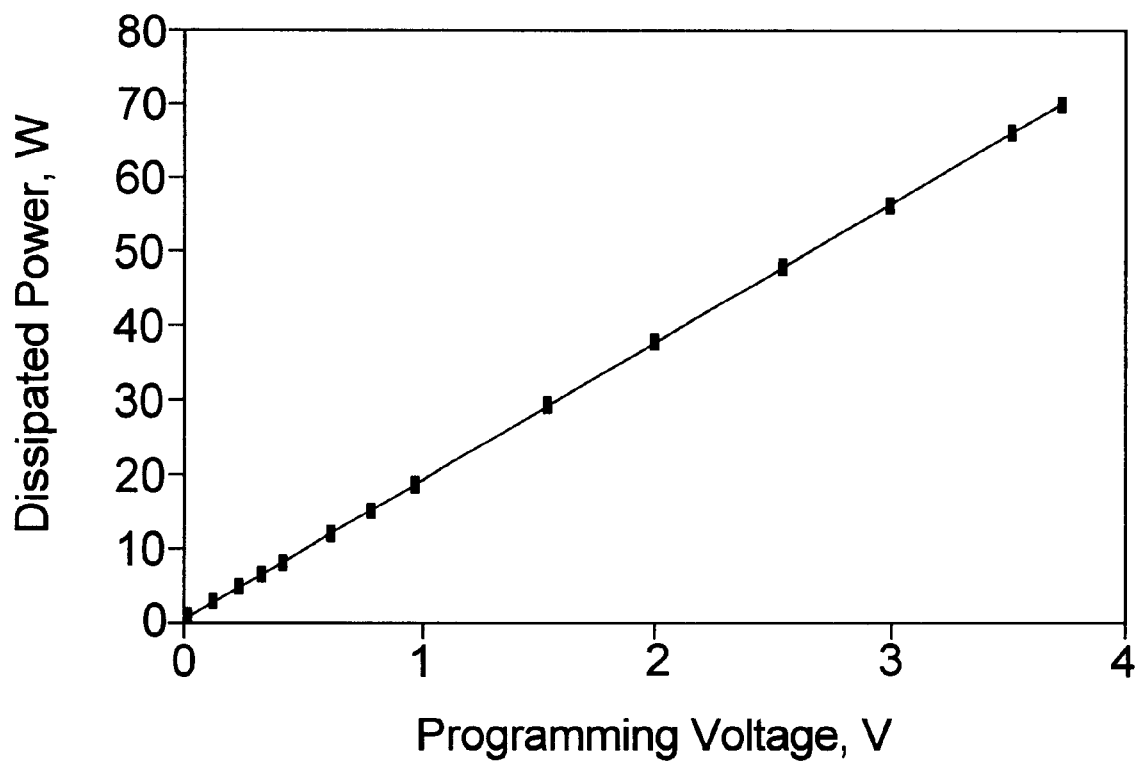
FIG. 3 is a graph illustrating operation of the present invention.

It will be seen that the power dissipated by the heating element 30 is precisely controlled by the voltage supplied thereto from the power operational amplifier 68 through the feedback loop. Reference is made to FIG. 3, wherein it is shown that with the present apparatus, power dissipated by the heating element 30 bears a direct linear (proportional) relation to programming voltage 70 supplied to the power operational amplifier 68. The apparatus shown and described compensates for variations in resistance of the heating element 30 due to temperature damage thereof, so that the appropriate level of power dissipated by the heating element 30 can be achieved.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. Apparatus for providing a chosen level of power dissipation of a resistor, the resistance of the resistor changing upon change in temperature thereof, comprising:

a shunt in series with the resistor;

a first differential amplifier, voltage drop across the resistor being provided to first and second input terminals thereof;

a second differential amplifier, voltage drop across the shunt being provided to first and second input terminals thereof;

a voltage multiplier having first and second input terminals which are connected to the respective output terminals of the first and second differential amplifiers;

a power operational amplifier, an output terminal of the voltage multiplier being connected to a first input terminal of the power operational amplifier;

a second input terminal of the power operational amplifier provided for receiving a programming sequence voltage;

an output terminal of the power operational amplifier being connected to the resistor for providing voltage thereto.

2. The apparatus of claim 1 wherein, upon a given change in current level in the resistor and shunt, the resistance of the shunt changes in a manner different from the resistance of the resistor.

3. The apparatus of claim 2 wherein the resistance of the shunt remains substantially constant upon change in current level therein.

4. The apparatus of claim 1 wherein the resistor is a heater.

5. The apparatus of claim 4 wherein the resistor is a heater of a thermal head assembly.

6. The apparatus of claim 5 wherein the resistance of the resistor is substantially greater than the resistance of the shunt.

7. The apparatus of claim 1 wherein the resistance of the resistor is substantially greater an the resistance of the shunt.

8. The apparatus of claim 7 wherein the resistor is a heater.

9. The apparatus of claim 8 wherein the resistor is a heater of a thermal head assembly.

* * * * *